FIELD EFFECT DEVICE AND METHOD OF MANUFACTURING THE SAME

Original Filed Feb. 19, 1962 3 Sheets-Sheet 1

INVENTORS
Raymond M. Warner Jr.
George C. Onodera
Wilfred J. Corrigan
BY
Mueller & Aichele
ATT'YS.

FIELD EFFECT DEVICE AND METHOD OF MANUFACTURING THE SAME

INVENTORS
Raymond M. Warner Jr.
George C. Onodera
Wilfred J. Corrigan
BY
Mueller & Aichele
ATT'YS.

FIELD EFFECT DEVICE AND METHOD OF MANUFACTURING THE SAME

Original Filed Feb. 19, 1962 3 Sheets-Sheet 3

INVENTORS
Raymond M. Warner Jr.
George C. Onodera
Wilfred J. Corrigan
BY
Mueller & Aichele
ATT'YS.

United States Patent Office 3,223,904

Patented Dec. 14, 1965

3,223,904

FIELD EFFECT DEVICE AND METHOD OF MANUFACTURING THE SAME

Raymond M. Warner, Jr., Scottsdale, George C. Onodera, Phoenix, and Wilfred J. Corrigan, Scottsdale, Ariz., assignors to Motorola, Inc., Chicago, Ill., a corporation of Illinois Continuation of abandoned application Ser. No. 173,970, Feb. 19, 1962. This application Mar. 31, 1965, Ser. No. 445,864

15 Claims. (Cl. 317—235)

This application is a continuation of application Serial No. 173,970, now abandoned, filed February 19, 1962.

This invention relates generally to semiconductor devices of the field effect type, and to methods of manufacturing them. In particular, the invention relates to a field effect semiconductor device in which the semiconductor unit has an internal channel of epitaxial material that makes the electrical parameters of the device stable, and also makes it possible to optimize those parameters at values which are desirable for a wide variety of circuit applications.

The electrical operation of field effect semiconductor devices depends upon modulation of the conductance of a thin region of semiconductor material by transverse electric fields. The region where this modulation takes place is known as the channel of the device, and the rectifying connection to the channel region which produces the transverse electric field in the channel is known as a gate. Some devices have only one gate connection, and others have a gate connection on each side of the channel. Current flows between a source connection at one end of the channel and a drain connection at the other end of the channel, and this current may be modulated by varying the bias of the gate connection. A device of this type may be operated as a transistor which exhibits gain and has high input and output impedances. If the gate is self-biased, the device may be operated as a current limiter which is particularly useful where a constant current circuit element is desired.

Although field effect semiconductor devices have been investigated extensively, there are practical defficulties in making them which have held back large scale commercial production of such devices. One specific problem is that the channel of the device should be very thin, preferably no more than a few microns thick, and it should have a relatively high sheet resistivity value. It has been extremely difficult to form such thin semiconductor regions with the degree of dimensional control and resistivity control that is required in order to manufacture the devices in large quantities on a reproducible basis.

Another problem that has been encountered is that the electrical parameters of some known field effect devices have not been as stable as desired. The instability has been largely due to the effect of changes in the environment about the semiconductor unit. In many structures which have been proposed up to the present time, either the channel region or the adjoining junctions, or both, have been exposed to the environment about the semiconductor unit. Since these areas are highly sensitive to environmental changes, the electrical parameters have been somewhat unstable, even when the semiconductor unit has been provided in a hermetically sealed conntainer. Although field effect devices having an internal channel have been proposed, the structures have been such that they could not be manufactured economically by mass production techniques.

Accordingly, it is an object of this invention to provide a field effect semiconductor device whose electrical parameters exhibit sufficient stability to make the device commercially acceptable.

Another object of the invention is to provide a field effect semiconductor device having a thin internal channel region which can be fabricated reproducibly so that the electrical parameters of the completed devices are reasonably uniform and have values which are suitable for a variety of circuit applications.

Another object of the invention is to provide a method of fabricating a field effect semiconductor device by which an extremely thin channel region is formed entirely within the semiconductor unit, and the source, drain and gate regions of the unit are formed by steps which do not adversely affect the thickness of the channel region, such that the channel thickness can be controlled accurately.

A feature of the invention is a method of fabricating a field effect semiconductor unit in which the thickness of the channel region is determined by an epitaxial growth step, and the lateral geometry of the channel region is determined by a diffusion step. These steps are capable of producing the desired channel thickness and geometry with a high degree of dimensional accuracy, even though the dimensions involved are extremely small.

Another feature of the invention is a field effect semiconductor device having a thin epitaxial layer inside the semiconductor unit of the device, with the epitaxial layer determining the thickness of the channel region of the device. Extremely thin epitaxial semiconductor layers can be grown reproducibly, and thus the thickness of the channel region can be controlled accurately even though the thickness dimension may be as small as one micron.

Another feature of the invention is the provision of a field effect semiconductor unit having two epitaxial layers on a substrate crystal, one overlying the other, with diffused source and drain regions which extend through the outer layer to the inner layer such that the portion of the inner epitaxial layer between the diffused regions constitutes the channel of the device, and the portion of the outer epitaxial layer between the diffused regions constitutes a gate of the device. The channel is thus buried within the semiconductor unit, and its lateral geometry is determined by the placement of the diffused regions.

Another feature of the invention is the provision of a field effect semiconductor unit having two superimposed epitaxial layers on a crystal substrate with the epitaxial layers and the substrate all having about the same doping level, so that after the epitaxial layers are grown, the position of the junctions which form the boundaries of a channel region in the inner epitaxial layer will not change appreciably during subsequent processing steps. As a result, the thickness of the channel region is not altered significantly by processing subsequent to epitaxial growth.

The invention is illustrated in the accompanying drawings in which.

Figures 1, 2:
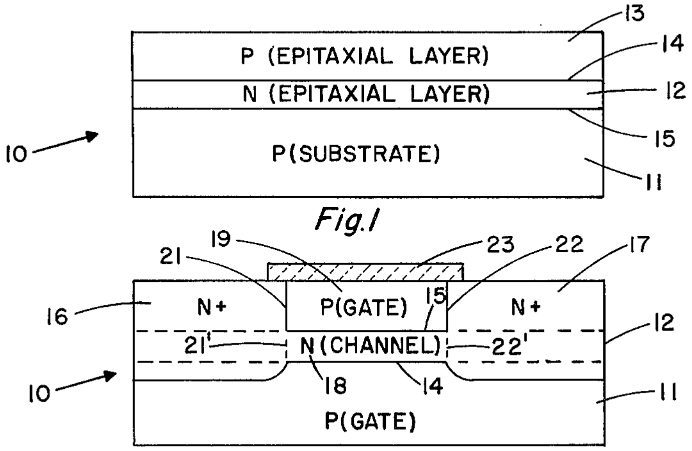
FIG. 1 is a schematic cross sectional view on an exaggerated scale of a semiconductor unit having two epitaxial layers superimposed on a substrate crystal, and this view illustrates the cross sectional configuration of one embodiment of the invention in an incomplete form as it appears after the epitaxial growth processing.
FIG. 2 is a schematic cross sectional view which illustrates the manner in which impurities may be diffused into the semiconductor unit of FIG. 1 to define the lateral geometry of the various regions of the unit.

Before describing the invention further, certain terms that will be used in the description will be defined.

Epitaxial material, as that term is used herein, means monocrystalline material whose crystallographic orientation is determined by a crystal substrate on which it is formed. The process by which epitaxial material is formed is known as epitaxial growth, or sometimes as epitaxis. At least one crystallographic plane of the substrate crystal has the same lattice constants as the desired epitaxial layer, and the epitaxial layer is grown on a surface parallel to that plane. The material of the epitaxial layer and the substrate may be chemically the same, although this is not theoretically essential.

The term sheet resistivity means the resistance of a square region or piece of semiconductor material of a given thickness, as measured between two imaginary faces which are perpendicular to the plane of the square region. Sheet resistivity values will be given in units of ohms per square.

As mentioned previously, the channel region and one gate region of a field effect semiconductor device in accordance with the invention are formed within epitaxial semiconductor material that is grown on a semiconductor crystal substrate from the gas phase. Preferably, two epitaxial semiconductor layers are grown on the substrate, one on top of the other, and the cross sectional configuration of a typical semiconductor unit at this stage of the processing is shown on an exaggerated scale in FIG. 1. In this embodiment, the semiconductor crystal substrate 11 of the unit 10 is of P type conductivity, although it will be understood that the substrate may be of N type conductivity if desired. The first epitaxial layer 12 grown on the substrate is of the conductivity type opposite to that of the substrate, and the second epitaxial layer 13 is of the same conductivity type as the substrate. Thus, for a P type substrate, the first layer 12 is of N type conductivity, and the second layer 13 is of P type conductivity. There are rectifying junctions 14 and 15 at the boundaries of the first epitaxial layer 12. The channel region of the final device is a portion of the first epitaxial layer 12. In order to achieve desirable electrical parameters, it is desirable to make the channel region very thin. Thus, the epitaxial layer 12 typically has a thickness in the range from about 0.8 to 3 microns. The thickness of the second epitaxial layer 13 is not critical, and it may be about twice as thick as layer 12. The thickness of the substrate is not critical either, and it may be much thicker than layers 12 and 13.

The lateral geometry of the channel region is preferably defined by a diffusion step, and the cross sectional configuration of the semiconductor unit after this step is illustrated on an exaggerated scale in FIG. 2. The diffused regions 16 and 17 constitute ohmic source and drain connections to the channel region 18 of the unit. This is accomplished by making the diffused regions 16 and 17 have the same conductivity type as the first epitaxial layer 12, and by making them extend at least to that layer. In the embodiment illustrated in FIG. 2, the diffused regions 16 and 17 are of N type conductivity, but since they are more heavily doped than the original N type epitaxial layer 12, they are labeled N+. The channel region 18 is that portion of the first epitaxial layer 12 which lies between the diffused regions 16 and 17. The portion 19 of the second epitaxial layer 13 located between the diffused regions 16 and 17 is one gate region of the device, and the substrate crystal 11 constitutes another gate region of the device. The position of the junctions 14 and 15 which define the thickness of the channel region 18 is determined by the epitaxial growth process, and the position of the junctions 21 and 22 which form the lateral boundaries of the upper gate region 19 is determined by the diffusion process. The length of the channel may be about 100 microns or less.

Junctions 21 and 22 have nonrectifying portions 21' and 22' which are shown by vertical dashed lines in FIG. 2, and these portions define the ends of the channel region 18. The boundaries of layer 12 outside the channel 18 are also shown by dashed lines in FIG. 2 since there are no rectifying junctions at these boundaries after the diffusion step, assuming that the diffused regions penetrate through layer 12 as is the case in FIG. 2.

The diffusion may be carried out by masking the portion of the major surface of the second epitaxial layer 13 where it is desired to form the gate region 19 with a protective layer 23 which prevents doping impurities from diffusing into the underlying semiconductor material to any significant extent. The surfaces of layer 13 at which the diffused regions 16 and 17 are to be formed are left exposed. Donor type impurity material is diffused into the semiconductor unit at the exposed areas of the unit, and this diffusion step may be carried out in a diffusion furnace as will be described further in connection with FIG. 3. The resulting diffused regions 16 and 17 extend from the upper surface of the epitaxial layer 13 entirely through that layer and at least into the first epitaxial layer 12. The depth of diffusion is not critical. The diffused regions may penetrate through the first epitaxial layer 12 into the substrate crystal in the manner shown in FIG. 2 without significantly affecting the geometry of the channel region 18. The semiconductor unit 10 of FIG. 2 can be fabricated on a reproducible basis without requiring close control of the diffusion depth, and this facilitates mass production of the units.

A method of fabricating a semiconductor unit 10 of silicon will be described with reference to FIG. 3. It will be apparent, however, that other semiconductor materials, such as germanium or gallium arsenide, may be used if desired. The starting material is a monocrystalline wafer of P type silicon. Such wafers are obtained from larger silicon crystals which may be grown by zone melting or crystal pulling techniques that are well known in the art. The doping impurity in the silicon may be boron, for example. The grown crystal is sliced, and the slices are lapped, polished and otherwise processed to make their major faces as smooth and free from damage as possible. The grown crystal is sliced so that the faces of the slices or wafers are parellel to a particular crystallographic plane of the wafer, such as that identified by Miller Indices (1,1,1). A section 11 of such a wafer is shown in perspective at the top of FIG. 3, but it should be understood that the section 11 is only a small part of a complete wafer.

The wafer 11 is the crystal substrate on which the epitaxial layers 12 and 13 are grown in steps A and B of the process. The epitaxial layers may be grown and simultaneously doped by depositing silicon and a doping impurity from vapors which contain these materials on to the substrate crystal 11 while maintaining the substrate at a temperature in the range from 1000° C. to 1300° C., and preferably at about 1150° C. In one suitable process for the epitaxial growth of silicon layers, the substrate is heated in a reaction chamber, and a gas stream of hydrogen saturated with vapors of a silicon halide compound, such as silicon tetrachloride or trichlorosilane, is passed over the heated wafers in the reaction chamber. A heterogeneous reaction takes place at the wafer surfaces, and a film or layer of silicon grows in monocrystalline form on the surface of the wafer. The conductivity type and resistivity value of the epitaxial layer is controlled by adding controlled amounts of a heat-decomposable compound of the impurity element to the gas stream, so that impurity material deposits in elemental form along with the silicon on the substrate. For growing N type epitaxial layers, suitable impurity compounds are the hydrides and halides of phosphorous, arsenic and antimony. For growing P type epitaxial layers, the hydrides and halides of boron are suitable impurity compounds.

The best results have been obtained using phosphine for growing N type layers and diborane for growing P type layers. An epitaxial growth and doping process using these materials is described and claimed in a copending application of J. T. Law, which issued March 16, 1965 as Patent No. 3,173,814, and is assigned to the present assignee. In order to grow an N type epitaxial layer 12 with a resistivity value of about 0.5 ohm-centimeters, hydrogen gas containing about 100 parts per million of phosphine may be injected at a flow rate of about 100 cubic centimeters per minute into a pure hydrogen gas stream flowing at 10 liters per minute to form a dilute phosphine-hydrogen mixture. The 100 cubic centimeters per minute of the mixture is injected into a main hydrogen gas stream which is saturated with vapors of silicon tetrachloride and flows to the reaction chamber at a flow rate of about 30 liters per minute. An N type epitaxial layer 12 with a thickness of 1.5 microns may be grown in 5 minutes at a substrate temperature of 1180° C. using the flow rates just referred to. Then in order to grow a P type epitaxial layer 13 on top of the layer 12, diborane diluted with hydrogen to a concentration of about 100 parts of diborane per million parts of hydrogen is injected at a flow rate of about 100 cubic centimeters per minute in place of the phosphine. A P type layer 13 with a resistivity value of about 0.5 ohm-centimeter and a thickness of about 3 microns can be grown in about 10 minutes at a substrate temperature of 1180° C.

In order to keep the positions of the junctions 14 and 15 constant within the unit 10, despite some inter-diffusion of the doping impurities, it is desirable to make the substrate 11 and the layers 12 and 13 all have about the same impurity concentration. By forming the layers 12 and 13 by epitaxial growth as set forth in the preceding paragraph, the doping and the resistivity will be substantially uniform throughout each layer. Because N type material has greater carrier mobility than P type material the resistivity value of the P type material in layer 12 will be about 3 times that of the N type material in the substrate 11 and the layer 13 if the doping level is the same in all regions. The resistivity value of layer 12 may be in the range from about 0.01 to 10 ohm-centimeters, and a preferred range is from 0.2 to 2 ohm-centimeters. The lower the resistivity value of layer 12, the thinner it must be in order to achieve a reasonably low pinch-off voltage. As the thickness of layer 12 decreases, it becomes increasingly difficult to control the thickness of the layer accurately. By growing the layer 12 epitaxially, it is possible at the present state of the art to control its thickness with sufficient accuracy down to a thickness value of about 0.1 micron. If the resistivity of the layer 12 is in the range from 0.2 to 2 ohm-centimeters, the thickness of that layer may be in the range from 0.8 to 3 microns. If the layer 12 has a resisitivity value of 0.2 ohm-centimeter and a thickness of 0.8 micron, the sheet resistivity value of the layer is about 2500 ohms per square. At the other extreme, if the layer 12 has a resistivity value of about 2 ohm-centimeters and a thickness of about 3 microns, the sheet resistivity value of the layer is about 6700 ohms per square. The ranges of values just referred to provide a device with a pinch-off voltage of about 6 volts.

It is possible to grow additional epitaxial layers on the wafer 11 before growing layers 12 and 13, particularly if the added layer or layers have the same conduction properties as the wafer. Such added layers, if provided, may be considered as part of the substrate of the semiconductor unit.

Figure 4:
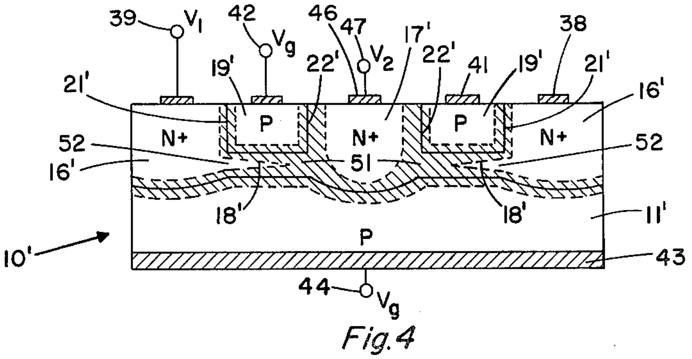
FIG. 4 is a schematic cross sectional view of a semiconductor unit similar to that shown in FIG. 2, and in this view the cross-hatched areas represent the field regions, or depletion regions, which spread into the channel from the junctions of the unit when it is operated.

After the epitaxial layers 12 and 13 have been grown, a masked diffusion step (step C) is carried out in order to form the source and drain regions. Several semiconductor units may be obtained from a single wafer in the manner shown by steps C and D of FIG. 3. The various regions of the semiconductor unit 10' shown at step D of FIG. 3 have a closed configuration, and FIG. 4 is an enlarged view which illustrates the cross sectional configuration of the unit 10'. The gate region 19' is annular, and the source region 16' surrounds the gate 19'. The drain region 17' is inside the upper gate, and the channel region 18' has the same closed configuration as the upper gate. The substrate 11', which constitutes the other gate region, is the same as that of the unit 10 shown in FIG. 2.

A masking pattern, preferably of silicon dioxide material, is formed on the surface of layer 13 as part of step C. The individual masks 23' are defined as to configuration by photoengraving techniques. Only half of each mask 23' appears in FIG. 3 because a portion of each semiconductor unit 10' has been cut away to reveal the internal construction. The silicon dioxide layer may be formed by heating the wafer at a temperature of about 1100° C., for a time of about 1 hour and 15 minutes in an atmosphere of steam. The resulting silicon dioxide film is about 7500 angstrom units thick. A coating of photoresist material, such as that available under the trademark KPR, is then applied uniformly over the silicon dioxide film. The photoresist coating is exposed to light through a separate photoengraving mask which has clear areas of the same configuration as the desired diffusion masks 23'. The unexposed portions of the photoresist coating are then removed by dissolving them in a developer solution, which is available commercially, leaving a pattern of photoresist on the wafer whose configuration is the same as that of the desired diffusion mask 23'. The wafer is then immersed in a solution of 1 part hydrofluoric acid and 4 parts ammonium fluoride which dissolves those portions of the silicon dioxide film that are not protected by the photoresist material. Then, the remaining photoresist material is removed from the wafer, leaving only the desired diffusion mask 23' on the surface of the wafer.

The diffusion phase of step C (FIG. 3) is carried out in a suitable diffusion furnace. By way of example, phosphorus may be diffused into the wafer from vapors of phosphorus pentoxide in a diffusion furnace while heating the wafer at a temperature of about 1100° C. for a time of about 1 hour. The resulting diffused regions 16' and 17' (FIG. 3E) penetrate through the P type epitaxial layer 13 (FIG. 3B) to the N type epitaxial layer 12, and may even penetrate through the N type layer 12 as shown at step D of FIG. 3, and also in FIG. 4. The diffused regions have been stippled in FIG. 3 in order to make them distinguishable from the bulk material. Ohmic connections are made to the diffused regions 16' and 17' and also to the gate region 19' by depositing metal such as aluminum or gold on the respective regions to form contact areas to which lead wires may be bonded. The configuration of the metallized deposits may be defined by photoengraving techniques in the same manner as has been described in connection with the formation of the diffusion masks 23'.

Those portions of the silicon dioxide masks 23' which cover the junctions 21' and 22' (FIG. 4) may be left on the semiconductor unit if desired, and this helps to stabilize the electrical parameters of the completed devices.

However, it has been found that if the semiconductor unit it encapsulated within a hermetically sealed container, the electrical parameters are adequately stable even when the silicon oxide material is removed, because of the internal location of the channel region 18' within the semiconductor unit.

Figure 3:
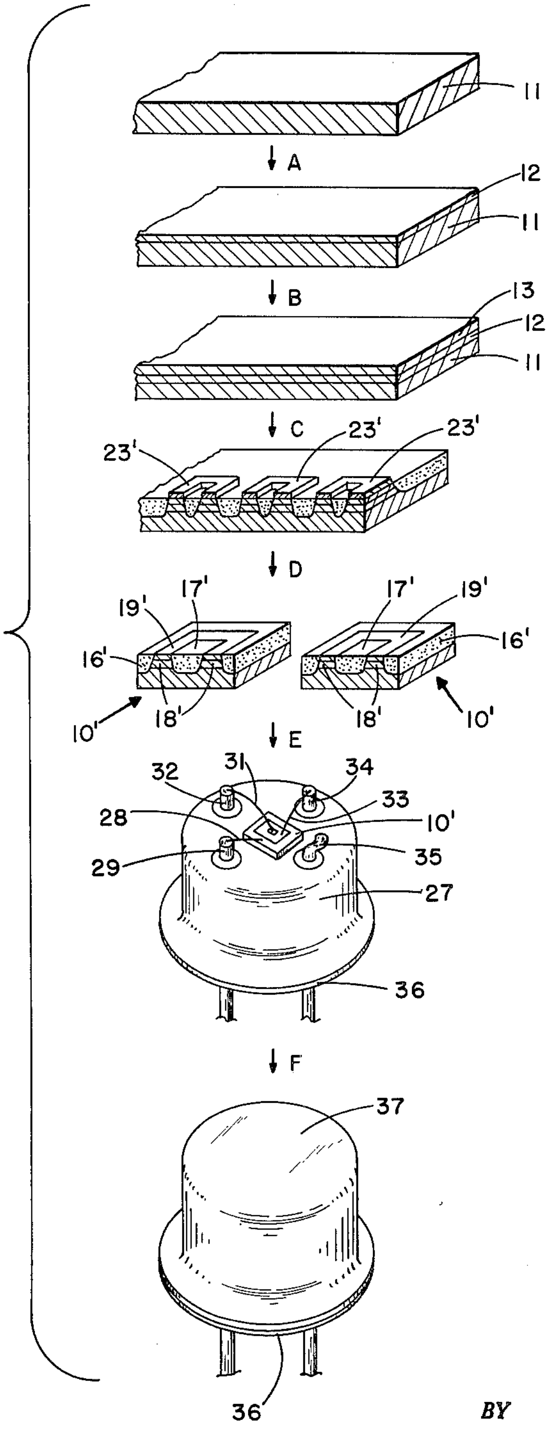
FIG. 3 illustrates the main steps of a method of fabricating a field effect semiconductor device in accordance with the invention.

The mounting of the semiconductor unit 10' and the bonding of contact wires to the metallized contacts on the upper surface of the unit is illustrated at step E of FIG. 3. The substrate crystal material 11 may be fused directly to the metallic body of the header 27 using a suitable solder such as gold-germanium eutectic. The lower gate region is then grounded to the header. If desired, however, the crystal element may be insulated from the header in the manner shown in FIGS. 6 and 7, as will be further described. In the embodiment of FIG. 3, a contact wire 28 connects one lead member 29 to the source region 16' of the semiconductor unit 10'. Another contact wire 31 connects the lead member 32 to the drain region 17' of the semiconductor unit 10', and a third contact wire 33 connects the other lead wire 34 to the gate region 19'. The lead wires 29, 32 and 34 are insulated from the metallic body of the header 27, and the other lead 35 is bent over and connected to the header. All of the lead members have portions projecting from the bottom of the header which are available for making external electrical connections to the device. In step F of FIG. 3, a cover 37 is sealed to the flange 36 of the header, for instance by welding, and this provides a hermetically sealed enclosure for the semiconductor unit 10'. The completed device is shown at step F on a scale of about 5 times actual size.

It has been found that it is possible to modify the sheet resistivity of the epitaxial layer 12 by carrying out a heat treatment step after step C. This may be accomplished without changing the positions of the junctions 14 and 15 because of the fact that the epitaxial layers and the substrate crystal all have about the same impurity concentration. If for example several wafers are processed simultaneously through steps A, B and C of FIG. 3, it may be determined from electrical measurements that one or more of the epitaxial layers 12 on the wafers has a sheet resistivity value which is too low. By heating those particular wafers at a temperature of about 1100° C., some N type impurities will diffuse from the layer 12 into the adjoining regions, and conversely some P type impurities will diffuse from layer 13 and the substrate 11 into the intermediate layer 12. Since the doping level is initially approximately the same in all of these regions, the interdiffusion does not alter the positions of the junctions, but it does increase the sheet resistivity of the epitaxial layer 12 in which the channel region of the device is formed. By heat treating wafers in this manner, it has been possible to decrease the pinch-off current of a field effect device from a value of 100 milliamps down to a value as low as 1 milliamp without degrading the electrical characteristics of the device.

In order to illustrate the electrical operation of the device of the invention, the depletion regions which spread out from the junctions of the unit 10' have been shown schematically in FIG. 4 by dashed lines and hatching. In FIG. 4, the source contact 38 is annular, and is connected to a source voltage $V_1$ at terminal 39. The gate contact 41 is also annular, and is connected to a source of voltage $V_g$ at terminal 42. The other gate contact 43 for the substrate portion 11' of the unit is connected to a terminal 44 which may also be at voltage $V_g$. The drain contact 46 is connected to a source of voltage $V_2$ at terminal 47.

Figure 5:
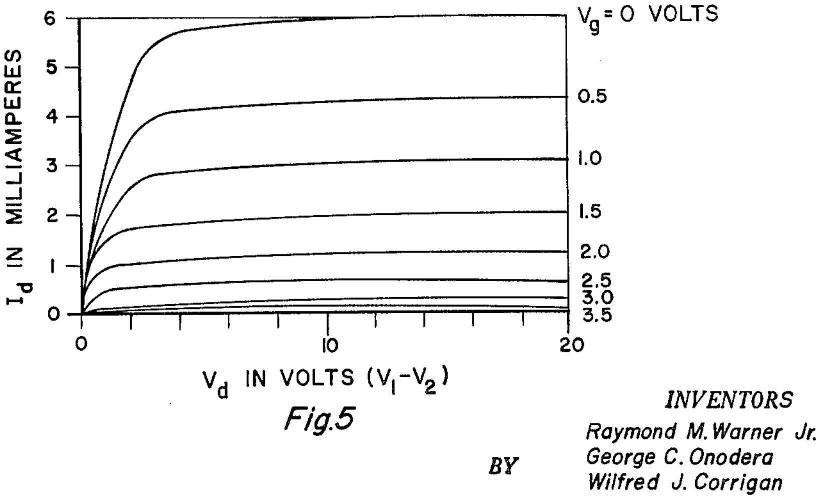
FIG. 5 illustrates by way of example the voltage-current characteristics of a field effect semiconductor device in accordance with the invention.

FIG. 5 illustrates the electrical characteristic of the semiconductor unit 10' of FIG. 4 for various values of the voltages identified in FIG. 4. The potential difference $V_d$, which is equal to $V_2-V_1$, is plotted along the horizontal axis in FIG. 5, and the current $I_d$ between the source and drain contacts 38 and 46 is plotted along the vertical axis. The various curves are for different values of gate voltage $V_g$ as identified in FIG. 5. The phenomenon called pinch-off occurs when the current $I_d$ becomes substantially independent of the applied voltage $V_d$. Pinch-off occurs at the knee of the curve for any given gate voltage $V_g$, and after pinch-off the voltage-current characteristic is linear and represents a substantially constant current. From FIG. 5 it may be seen that for each curve, the ratio of pinch-off voltage to pinch-off current is relatively low. The initial resistance of the device is proportional to this ratio, and therefore the device has a reasonably low initial resistance, which is desirable for most circuit applications. The initial resistance of practical devices in accordance with the invention can range between wide limits depending upon geometric design of the device, and is typically in the range from about 100 ohms to 300 ohms.

From FIG. 4, it may be seen that pinch-off occurs when the depletion regions merge within the channel 18'. When electron current flows from the source region 16' through the channel 18' to the drain region 17', there is a gradual voltage increase along the length of the channel which causes the depletion regions to extend farther into the channel at its inner end 51 than at its outer end 52. This means that the depletion regions will merge first at the inner end 51 of the channel, and any further increase in the applied voltage $V_d$ does not significantly affect the level of the current $I_d$ flowing through the channel. The current through the channel may be controlled or modulated by varying the gate voltage $V_g$.

Figure 6:
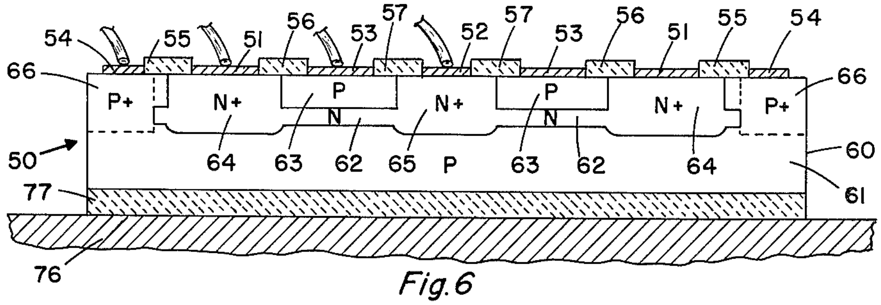
FIG. 6 is a schematic cross sectional view on an exaggerated scale which illustrates the internal configuration of a field effect transistor embodiment of the invention in which all of the junctions emerge at the top surface of the semiconductor unit.
Figure 7:
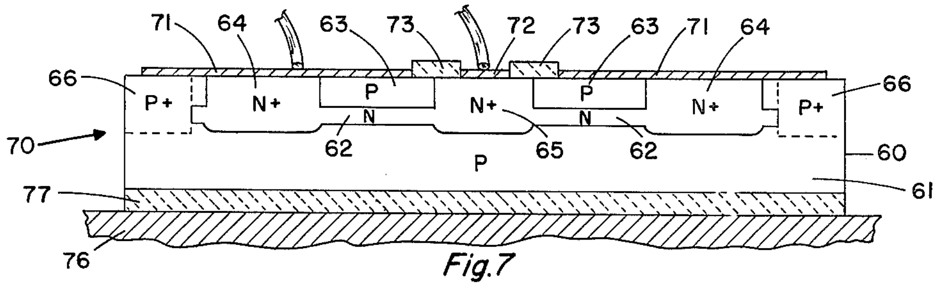
FIG. 7 is a view similar to FIG. 6 of a modified form of the device which is adapted for use as a current limiter.

The devices 50 and 70 of FIGS. 6 and 7 have identical semiconductor units 60, the only difference being that the device 50 of FIG. 6 has individual source, drain and gate contacts 51, 52, 53 and 54, whereas the device 70 of FIG. 7 has one contact 71 which makes ohmic contact to the source region and to both of the gate regions, and another contact 72 which makes ohmic contact to the drain region. The device 50 of FIG. 6 is intended for use as a field effect transistor, and the device 70 of FIG. 7 is intended for use as a current limiter. In each of these devices, the semiconductor unit 60 has a P type substrate crystal 61 which constitutes one gate region, a first epitaxial layer which defines the thickness of the annular N type channel region 62, and a second epitaxial layer which defines the thickness of the annular gate region 63. The annular N type diffused region 64 on the outside of the gate 63 is the source region, and the other diffused region 65 on the inside of the gate 63 is the drain region. In addition, the semiconductor unit 60 has another annular diffused region 66 which is spaced outwardly from the source region 64. The diffused region 66 is doped with a P type impurity such as boron to make it of the same conductivity type as the substrate crystal, and the region 66 extends from the upper surface of the unit 60 into the substrate crystal. Thus, the region 66 constitutes an ohmic connection to the lower gate region formed by the substrate crystal.

Since the region 66 is available at the upper surface of the semiconductor unit, the gate contact 54 may provided at this surface rather than on the bottom surface of the semiconductor unit in the manner shown in FIG. 4. The configuration of the units of FIGS. 6 and 7 has certain advantages. It may be seen that there is no exposed junction at the periphery of the semiconductor unit, and this means that the semiconductor wafer which is divided to form individual units (step D of FIG. 3) can be scribed and broken into semiconductor units without degrading the electrical characteristics of the device. If one of the junctions emerges at the periphery of the unit, some damage may occur at the exposed edge of the junction in the breaking step, and this may degrade the electrical characteristics slightly. Another advantage of the configuration of FIGS. 6 and 7 is that some of the silicon oxide material which acts as a mask during the diffusion steps may be left on the upper surface of the unit 60 in order to provide a protective coating over the junctions that emerge from the unit at its upper surface. The unit 60 of FIG. 6 has three rings of silicon dioxide identified 55, 56 and 57 on its upper surface, and these silicon dioxide rings cover all of the junctions which emerge at the surface of the unit. The unit 60 of FIG. 7 has only one ring of silicon dioxide 73, and this covers the junction between the drain region 65 and the gate region 63. The other two junctions which emerge at the top surface of the semiconductor unit of FIG. 7 are shorted out by the metallic contact 71, and this makes the source region 64 and both of the gate regions 61 and 63 electrically common with each other.

The semiconductor unit 60 of FIGS. 6 and 7 may be electrically insulated from the metallic body 76 on which it is mounted. The body 76 may be the metallic body of a header such as the header 27 shown in FIG. 3. The material 77 which provides electrical insulation is preferably a good conductor of heat so that heat can flow from the semiconductor unit to the header when the device is operating. Alumina and beryllia are electrically insulating but thermally conductive, and one of these materials may be used for the insulation 77. The material 77 may be coated with metallic material on both sides so that it may be soldered to the member 76 and also to the substrate portion 61 of the semiconductor unit.

Figure 8:
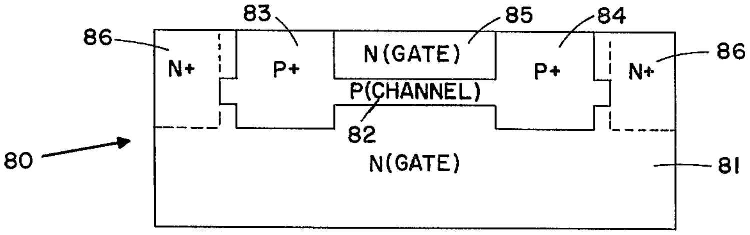
FIG. 8 is a schematic cross sectional view on an exaggerated scale showing a semiconductor unit which is the electrical complement of the units shown in FIGS. 1–7.

FIG. 8 illustrates an embodiment of the invention which has a substrate portion 81 of N type semiconductor material that forms one gate region of the unit. The channel region 82 and the diffused source and drain regions 83 and 84 are of P type material. The other gate region 85 is of N type material. A diffused region 86 similar to the diffused region 66 of FIG. 6 forms an ohmic connection to the substrate or gate region 81. Contact may be made to the region 86 at the upper surface of the semiconductor unit. It may be seen that the regions 81–86 of the semiconductor unit of FIG. 8 may be fabricated by epitaxial growth and diffusion in exactly the same manner as has been discussed in connection with FIGS. 1 to 7 except that the doping of the regions is reversed. Consequently, the semiconductor unit 80 is the electrical complement of the units illustrated in FIGS. 1–7.

Figure 9:
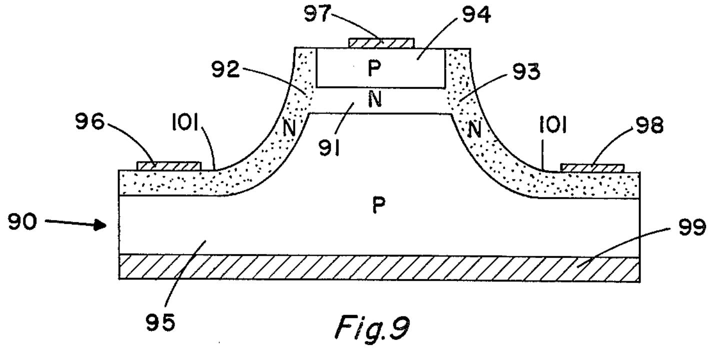
FIG. 9 is a schematic cross sectional view on an exaggerated scale showing a field effect semiconductor device which forms still another embodiment of the invention.

FIG. 9 illustrates an embodiment of the invention which is similar to the embodiments of FIGS. 1–7, but which has the channel 91 of the semiconductor unit 90 located in a projection, or a "mesa" as the projection is sometimes called. The channel 91 is an epitaxial layer, and the gate 94 is a second epitaxial layer. The unit 90 has diffused regions at 92 and 93 which are the source and drain regions, and the two gate regions are at 94 and 95. Contacts 96–99 may be provided for the various regions as shown.

The semiconductor unit 90 may be fabricated from a unit 10 as shown in FIG. 1 by essentially the same method as that described in connection with FIG. 3, except that prior to the diffusion step for forming the source and drain regions, the epitaxial layers around the selected portions where the gate and channel regions are to be formed are removed by etching to expose the surface of the substrate crystal at 101 (FIG. 9). The gate region 94 is protected with resist material during the etching step. In order to form the diffused regions 92 and 93, a diffusion mask is formed over the intended gate region 94, and the material is treated in a diffusion furnace in the same manner as has been described in connection with FIG. 3. The resulting diffused regions 92 and 93 define the lateral geometry of the gate region 94 and of the channel 91, and constitute ohmic connections to the channel 91. The thickness of the channel region 91 is determined by the first epitaxial layer that is grown on the original substrate crystal. Thus, the unit 90 has many of the same advantages as the units of FIGS. 1–8.

Summarizing briefly, the invention provides a field effect semiconductor device which has a channel region located entirely within the semiconductor unit. The internal location of the channel region helps to stabilize the electrical parameters of the device. If desired, the semiconductor unit may be constructed such that all of the junctions emerge at the top surface of the unit and are covered by a protective substance which further stabilizes the electrical parameters of the device. The semiconductor unit can be fabricated reproducibly by a method in which the thickness of the channel region of the final device is determined by an epitaxial growth step, and the lateral geometry of the channel region is determined by a masked diffusion step. As has been pointed out previously, epitaxial growth and masked diffusion are well suited to meet the requirements of close dimensional control that are involved in producing acceptable field effect semiconductor devices in large quantities.

We claim:

1. A semiconductor device of the field effect type including in combination, a semiconductor crystal element of a selected conductivity type and having a predetermined doping level, a first semiconductor layer on said crystal element of a conductivity type opposite to said selected conductivity type, said first layer having substantially uniform doping at said predetermined doping level and having a particular thickness and sheet resistivity, a second semiconductor layer of said selected conductivity type on said first layer, said second layer having substantially uniform doping at said predetermined doping level, said device having portions extending through said second layer and into said first layer and forming source and drain semiconductor regions of said opposite conductivity type, said source and drain regions defining the lateral limits of a channel region in said first layer and of a first gate region in said second layer, the portion of said crystal element engaging said channel region forming a second gate region, said channel region and said first and second gate regions forming first and second rectifying gate junctions respectively, said source and drain regions providing electrical connections to said channel region.

2. A semiconductor device of the field effect type including in combination, a semiconductor crystal element of a selected conductivity type and having a predetermined doping level, a first semiconductor layer of a conductivity type opposite to said selected conductivity type on said crystal element, said first layer having substantially said predetermined doping level and a particular thickness and sheet resistivity, a second semiconductor layer of said selected conductivity type on said first layer, said second layer extending to a major surface of the device and having substantially said predetermined doping level, said device having portions extending from said major surface forming source and drain semiconductor regions of said opposite conductivity type, said source and drain regions defining the lateral limits of a channel region in said first layer and of a gate region in said second layer and making electrical connections to said channel region, and a region of said selected conductivity type extending from said major surface into said crystal element and spaced laterally from said source and drain regions.

3. A semiconductor device of the field effect type including in combination, a semiconductor crystal element of a selected conductivity type and having a predetermined doping level, a first epitaxial semiconductor layer of a conductivity type opposite to said selected conductivity type on said crystal element, said first layer having substantially uniform doping at said predetermined doping level and having a particular thickness and sheet resistivity, a second epitaxial semiconductor layer of said selected conductivity type on said first layer, said second layer extending to a major surface of the device and having substantially uniform doping at said predetermined doping level, said device having first and second diffused portions extending from said major surface through said first and second layers and forming semiconductor drain and source regions of said opposite conductivity type, said source region being of annular configuration and extending about said drain region, said source and drain regions defining the lateral limits of a channel region in said first layer and of a gate region in said second layer and making electrical connections to said channel region, and a diffused region of said selected conductivity type extending from said major surface through said first and second layers into said crystal element, said last named region extending about and spaced from said source region.

4. A semiconductor device of the field effect type including in combination, a semiconductor crystal element of a selected conductivity type and having a flat surface and a predetermined doping level, a first epitaxial semiconductor layer on said flat surface of said crystal element of a conductivity type opposite to said selected conductivity type, said first layer having substantially uniform doping at said predetermined doping level and having a thickness such that the sheet resistivity is greater than 2500 ohms per square, a second epitaxial semiconductor layer of said selected conductivity type on said first layer, said second layer extending to a major surface of the device and having a thickness of the order of twice that of said first layer and substantially uniform doping at said predetermined doping level, said device having first and second diffused portions extending from said major surface through said first and second layers and forming semiconductor drain and source regions of said opposite conductivity type, one of said first and second portions being an annular region extending about the other of said portions, said source and drain regions defining a channel region in said first layer and a first gate region in said second layer and making electrical connections to said channel region, the portion of said crystal element engaging said channel region forming a second gate region, said channel region forming first and second rectifying gate junctions with said first and second gate regions respectively, and a diffused region of said selected conductivity type extending from said major surface through said first and second layers into said crystal element, said last named region extending about and spaced from said one portion and making an ohmic connection to said second gate region which is independent of said first gate region.

5. A semiconductor device of the field effect type including in combination, a semiconductor crystal element of a selected conductivity type having a top surface with a raised portion thereon, said crystal element having a predetermined doping level, a first semiconductor layer of a conductivity type opposite to said selected conductivity type on said raised portion of said crystal element and forming a channel region, said first layer having substantially uniform doping at said predetermined doping level and having a particular thickness and sheet resistivity, a second semiconductor layer of said selected conductivity type on said first layer and forming a gate region, said second layer having substantially uniform doping at said predetermined doping level, said first layer forming rectifying gate junctions with said crystal element and said gate region, said device having portions in engagement with said gate and channel regions forming source and drain semiconductor regions of said opposite conductivity type, said source and drain regions terminating said rectifying gate junctions and providing electrical connections to said channel region.

6. A semiconductor device of the field effect type including in combination, a semiconductor crystal element of a selected conductivity type and having a predetermined doping level, a first epitaxial semiconductor layer of a conductivity type opposite to said selected conductivity type on said crystal element and forming a channel region, said first layer having substantially uniform doping at said predetermined doping level and having a particular thickness and sheet resistivity, a second semiconductor region of said selected conductivity type at the surface of said first layer and forming a gate region, said device having diffused portions of said opposite conductivity type extending into said first layer and cooperating therewith to provide source and drain semiconductor regions forming effective ohmic electrical connections to the extremities of said channel region.

7. A semiconductor device of the field effect type including in combination, a semiconductor crystal element of a selected conductivity type and having a flat surface and a predetermined doping level, an epitaxial semiconductor layer of a conductivity type opposite to said selected conductivity type forming a channel region and having a first surface engaging said flat surface of said crystal element and an opposite surface, said channel region having substantially uniform doping at said predetermined doping level and having a particular thickness and sheet resistivity, a semiconductor region of said selected conductivity type at the opposite surface of said first layer and forming a first gate region at a major surface of the device, said device having first and second diffused portions of said opposite conductivity type extending from said major surface into said first layer and forming therewith semiconductor drain and source regions, one of said first and second portions being an annular region extending about the other of said portions, said source and drain regions forming effective ohmic electrical connections to the extremities of said channel region, the portion of said crystal element engaging said channel region forming a second gate region, said channel region and said first and second gate regions forming first and second rectifying gate junctions respectively, and a diffused region of said selected conductivity type extending from said major surface through said first layer and into said crystal element, said last named region extending about and being spaced from said one portion and making an ohmic connection to said second gate region which is independent of said first gate region.

8. A semiconductor device of the field effect type including in combination, a semiconductor crystal element of a selected conductivity type and having a flat surface and a predetermined doping level, an epitaxial semiconductor layer of a conductivity type opposite to said selected conductivity type forming a channel region and having a first surface engaging said flat surface of said crystal element and an opposite surface, said channel region having substantially uniform doping at said predetermined doping level and having a thickness such that the sheet resistivity is greater than 2500 ohms per square, a semiconductor region of said selected conductivity type at the opposite surface of said first layer and forming a first gate region at a major surface of the device, said gate region having a thickness of the order of twice that of said channel region, said device having first and second diffused portions of said opposite conductivity type extending from said major surface into said first layer and forming therewith semiconductor drain and source regions, one of said first and second portions being an annular region extending about the other of said portions, said source and drain regions forming effective ohmic electrical connections to the extremities of said channel region, the portion of said crystal element engaging said channel region forming a second gate region, said channel region and said first and second gate regions forming first and second rectifying gate junctions respectively, and a diffused region of said selected conductivity type extending from said major surface through said first layer and into said crystal element, said last named region extending about and being spaced from said one portion and making an ohmic connection to said second gate region, with said second gate region being independent of said first gate region.

9. A method of making a semiconductor unit for a semiconductor device of the field effect type, which unit has channel, gate, source and drain regions, said method including the steps of:

(a) providing a semiconductor crystal member of a selected conductivity type, (b) "epitaxially" growing a first semiconductor layer of the opposite conductivity type and of a particular thickness on the crystal member by depositing semiconductor material and impurity material from vapors thereof onto the crystal member at a uniform doping level throughout the layer, (c) epitaxially growing a second semiconductor layer of said selected conductivity type on the first layer by depositing semiconductor material and impurity material from vapors thereof onto the first semiconductor layer at a uniform doping level throughout the layer, (d) masking the surface of a first portion of the second layer to inhibit diffusion of impurities into the second layer and through the second layer into the first layer during a diffusion operation, while leaving exposed surfaces of second and third portions of the second layer which are separated from each other by the first portion, and (e) selectively diffusing impurity material into the second and third portions of the second layer and into the portions of the first layer underlying the second and third portions of the second layer to make the conductivity type of the resulting diffused regions the same as that of the first layer, to thereby form drain and source regions for the semiconductor device which define a channel region in the first layer and a gate region in the second layer, with said drain and source regions being connected to the channel region.

10. A method of making a semiconductor unit for a semiconductor device of the field effect type which unit has channel, first and second gates, source and drain regions, said method including the steps of:

(a) providing a semiconductor crystal member of a selected conductivity type and having a plane surface, (b) forming a channel region by epitaxially growing a first layer of semiconductor material of an opposite conductivity type on said plane surface of said semiconductor crystal member by depositing semiconductor material and impurity material from vapors thereof on said surface of said crystal element, whereby a rectifying junction is formed by the channel and a first gate region in the crystal member, (c) forming a second gate region by epitaxially growing a second layer of semiconductor material of said selected conductivity type at the surface of said first layer by depositing thereon semiconductor material and impurity material from vapors thereof, (d) masking a selected portion of said second layer of deposited semiconductor material to inhibit diffusion of impurities into the second layer and through the second layer into the underlying portions of the first layer during a diffusion operation, while leaving exposed other portions of said second layer about said selected portion, (e) and selectively diffusing impurity material into the exposed portions of said second epitaxial layer to define the lateral extent of the second gate region and into the underlying portion of said first layer to define the lateral extent of the channel region therein, with the diffused portions forming source and drain regions of the first conductivity type which constitute ohmic electrical connections to the extremities of the channel region.

11. A method of fabricating a semiconductor unit of the field effect type from a semiconductor crystal element of a selected conductivity type, which unit has a channel region located entirely within said semicondutor unit, first and second gate regions engaging said channel region and source and drain regions connected to the extremities of said channel region, said method including the steps of:

(a) epitaxially growing on the crystal element a first semiconductor layer of the conductivity type opposite to that of said crystal element and of a thickness to provide a sheet resistivity greater than 2500 ohms per square, to form a rectifying junction between the channel region in the first layer and a first gate region in the crystal element, (b) epitaxially growing on said first layer a second semiconductor layer of the same conductivity type as that of said crystal element and having a thickness of the order of twice that of said first layer, (c) masking the surface of a selected portion of said second layer at which the second gate region is to be formed while leaving exposed the surfaces of at least two other portions of said second layer which are separated from each other by said selected portion of said second layer, and (d) selectively diffusing impurity material through said exposed portions of said second layer and at least into the portions of said first layer underlying said exposed portions of said second layer to form source and drain regions having the same conductivity type as said first layer, which source and drain regions define the lateral extent of the channel region in said first layer and of the second gate region in said second layer.

12. A method of fabricating a semiconductor unit of the field effect type from a semiconductor crystal element of a selected conductivity type, which method provides a channel region that is located entirely within the semiconductor unit, said method including the steps of:

(a) epitaxially growing on the crystal element a first semiconductor layer of a particular thickness and of the conductivity type opposite to that of the crystal element and of substantially the same doping level as the crystal element, (b) epitaxially growing on said first layer a second semiconductor layer of the same conductivity type as that of the crystal element and of substantially the same doping level as the crystal element, (c) masking the surface of a selected portion of said second layer at which a gate region is to be formed while leaving exposed the surfaces of first and second other portions of said second layer which are separated from each other by said selected portion, (d) selectively diffusing impurity material through said first and second portions of said second layer and at least into the portions of said first layer underlying said first and second portions of said second layer to form source and drain regions having the same conductivity type as said first layer, which source and drain regions define the lateral extent of the channel region in said first layer and of the gate region in said second layer, (e) masking the surface of said second layer at an area extending over said selected portion and said first and second portions while leaving exposed the surface of said second layer at a further region spaced laterally outward from said portions, and (f) selectively diffusing impurity material into said further region of said second layer and the portions of said first layer and of said crystal element underlying said further region to make the conductivity type of the resulting diffused region the same as that of said crystal element, with said further region forming an electrical connection to said crystal element.

13. A method of fabricating a semiconductor unit of the field effect type from a semiconductor crystal element of a selected conductivity type, which method provides a channel region that is located entirely within the semiconductor unit, said method including the steps of:

(a) epitaxially growing on the crystal element a first semiconductor layer of a particular thickness and of the conductivity type opposite to that of the crystal element, (b) epitaxially growing on said first layer a second semiconductor layer of the same conductivity type as that of the crystal element, (c) masking the surface of a selected annular portion of said second layer at which a gate region is to be formed while leaving exposed the surface of said second layer at a first portion within the annular portion and a second portion about the annular portion, (d) selectively diffusing impurity material through said first and second exposed portions of said second layer and at least into the portions of said first layer underlying said exposed portions of said second layer to form source and drain regions having the same conductivity type as said first layer which define the lateral extent of the channel region in said first layer and of the gate region in said second layer, (e) masking the surface of said second layer over an area extending beyond said second portion while leaving exposed the surface of said second layer at a further region spaced laterally outward from said second portion, and (f) selectively diffusing impurity material into said further region of second layer and the portions of said first layer and of said crystal element underlying said further region to make the conductivity type of the resulting diffused region the same as that of said crystal element.

14. A method of making a semiconductor unit for a semiconductor device of the field effect type which unit has a channel region, first and second gate regions, and source and drain regions, said method including the steps of:

(a) forming a channel region by epitaxially growing a layer of semiconductor material of a first conductivity type on a plane surface of a semiconductor crystal element of an opposite conductivity type by depositing semiconductor material and impurity material from vapors thereof on said surface of said crystal element, whereby a rectifying junction is formed by the channel region and a portion of the crystal element which forms the first gate region, (b) forming a second gate region of said opposite conductivity type at the surface of said layer, (c) masking a selected annular portion of said layer of deposited semiconductor material to inhibit diffusion of impurities into the selected portion of said layer during a subsequent diffusion operation, while leaving exposed a first portion within the annular portion and a second portion about the annular portion, (d) selectively diffusing impurity material into the first and second exposed portions of said epitaxial layer to form therewith source and drain regions of the first conductivity type which provide electrical connections to the extremities of the channel region, (e) masking said layer of deposited semiconductor material over an area extending beyond said selected portion and said first and second portions to inhibit diffusion of impurities therein, while leaving exposed an outer portion of said layer, and (f) selectively diffusing impurity material into the outer exposed portion of said epitaxial layer and into the underlying crystal element to form a diffused region of the same conductivity type as that of said crystal element.

15. A method of making a semiconductor unit for a semiconductor device of the field effect type which unit has channel, gate, source and drain regions, said method including the steps of:

(a) forming a channel region by epitaxially growing a layer of semiconductor material of a first conductivity type on a plane surface of a semiconductor crystal element of an opposite conductivity type by depositing semiconductor material and impurity material from vapors thereof on said surface of said crystal element, whereby said crystal element forms a first gate region and a rectifying junction is formed by the channel and gate regions, (b) forming a second gate region of said opposite conductivity type at the surface of said layer, (c) masking a selected portion of said layer of deposited semiconductor material to inhibit diffusion of impurities into the layer during a subsequent diffusion operation, while leaving exposed other portions of said layer about said selected portion, (d) and selectively diffusing impurity material into the exposed portions of said epitaxial layer and into the underlying crystal element to form therewith source and drain regions of the first conductivity type which form electrical connections to the extremities of the channel region.

References Cited by the Applicant

UNITED STATES PATENTS

| | | |
|---|---|---|
| 2,692,839 | 10/1954 | H. Christensen et al. |
| 2,952,804 | 9/1960 | J. I. Franke. |
| 3,001,111 | 9/1961 | M. A. Chappey. |
| 3,014,820 | 12/1961 | J. C. Marinace et al. |
| 3,089,794 | 5/1963 | J. C. Marinace. |

OTHER REFERENCES

"A Semiconductor Current Limiter," Proceedings of the I.R.E., vol. 47, January 1959, pages 44–56.

JOHN W. HUCKERT, *Primary Examiner.*